United States Patent
Choi et al.

(10) Patent No.: US 10,915,026 B2
(45) Date of Patent: Feb. 9, 2021

(54) SUBSTRATE TREATING APPARATUS AND SUBSTRATE TREATING METHOD

(71) Applicant: SEMES CO., LTD., Cheonan-si (KR)

(72) Inventors: Hae-Won Choi, Daejeon (KR); Kihoon Choi, Cheonan-si (KR); Ki-Moon Kang, Yongin-si (KR); Chan Young Heo, Hwaseong-si (KR); Anton Koriakin, Cheonan-si (KR); Jaeseong Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 246 days.

(21) Appl. No.: 15/995,588

(22) Filed: Jun. 1, 2018

(65) Prior Publication Data

US 2018/0373154 A1 Dec. 27, 2018

(30) Foreign Application Priority Data

Jun. 23, 2017 (KR) .......................... 10-2017-0079594

(51) Int. Cl.
| | | |
|---|---|---|
| *G03F 7/40* | (2006.01) | |
| *G03F 7/42* | (2006.01) | |
| *H01L 21/67* | (2006.01) | |
| *H01L 21/677* | (2006.01) | |
| *H01L 21/027* | (2006.01) | |
| *H01L 21/02* | (2006.01) | |
| *G03F 7/20* | (2006.01) | |
| *G03F 7/038* | (2006.01) | |
| *G03F 7/039* | (2006.01) | |
| *G03F 7/32* | (2006.01) | |

(52) U.S. Cl.
CPC .............. *G03F 7/40* (2013.01); *G03F 7/038* (2013.01); *G03F 7/039* (2013.01); *G03F 7/32* (2013.01); *G03F 7/325* (2013.01); *G03F 7/422* (2013.01); *G03F 7/427* (2013.01); *G03F 7/70491* (2013.01); *H01L 21/0274* (2013.01); *H01L 21/02101* (2013.01); *H01L 21/67028* (2013.01); *H01L 21/67051* (2013.01); *H01L 21/67173* (2013.01); *H01L 21/67207* (2013.01); *H01L 21/67225* (2013.01); *H01L 21/67742* (2013.01)

(58) Field of Classification Search
CPC ........................................................ G03F 7/32
See application file for complete search history.

(56) References Cited

U.S. PATENT DOCUMENTS

2017/0349686 A1* 12/2017 Inoue ...................... C08F 12/20

FOREIGN PATENT DOCUMENTS

| JP | 2015-014726 A | 1/2015 |
|---|---|---|
| KR | 10-1227760 B1 | 1/2013 |
| KR | 10-1442566 B1 | 9/2014 |
| KR | 10-2015-0077719 A | 7/2015 |

* cited by examiner

*Primary Examiner* — Kathleen Duda
(74) *Attorney, Agent, or Firm* — Harness, Dickey & Pierce, P.L.C.

(57) ABSTRACT

Disclosed are a substrate treating apparatus and a substrate treating method. The substrate treating apparatus includes a first process chamber configured to supply a development liquid to a substrate that is carried into the first process chamber after an exposure process is performed on the substrate, a second process chamber configured to treat the substrate through a supercritical fluid, a feeding robot configured to transfer the substrate from the first process chamber to the second process chamber, and a controller configured to control the feeding robot such that the substrate is transferred to the second process chamber in a state in which the development liquid supplied by the first process chamber resides in the substrate.

10 Claims, 5 Drawing Sheets

SUBSTRATE TREATING APPARATUS AND SUBSTRATE TREATING METHOD

CROSS-REFERENCE TO RELATED APPLICATIONS

This application claims priority under 35 U.S.C. § 119 to Korean Patent Application No. 10-2017-0079594 filed on Jun. 23, 2017, in the Korean Intellectual Property Office, the disclosures of which are incorporated by reference herein in their entireties.

BACKGROUND

Embodiments of the inventive concept described herein relate to a substrate treating apparatus and a substrate treating method.

In order to manufacture a semiconductor device or a liquid crystal display, various processes such as photolithography, etching, ashing, ion implantation, thin film deposition, and cleaning are performed on a substrate. Among them, the photolithographic process is a process for forming a desired circuit pattern on a substrate, and an application process, an exposure process, and a development process are sequentially performed. A photosensitive liquid such as a photoresist is applied onto a substrate in the application process, a circuit pattern is exposed on the substrate in which a photosensitive film is formed in the exposure process, and an area of the substrate, on which the exposure process is performed, is selectively developed in the development process. Thereafter, the substrate is dried after the development liquid used in the development process is removed from the substrate.

SUMMARY

Embodiments of the inventive concept provide a substrate treating apparatus that may efficiently treat a substrate, and a substrate treating method.

Embodiments of the inventive concept also provide a substrate treating apparatus on which a cleaning/drying process is performed through a supercritical fluid in a photolithography, and a substrate treating method.

In accordance with an aspect of the inventive concept, there is provided a substrate treating apparatus including a first process chamber configured to supply a development liquid to a substrate that is carried into the first process chamber after an exposure process is performed on the substrate, a second process chamber configured to treat the substrate through a supercritical fluid, a feeding robot configured to transfer the substrate from the first process chamber to the second process chamber, and a controller configured to control the feeding robot such that the substrate is transferred to the second process chamber in a state in which the development liquid supplied by the first process chamber resides in the substrate.

The substrate may be provided after a negative photosensitive liquid is applied and the exposure process is performed, and the development liquid may be n-butyl acetate.

The substrate may be provided after a development process and a drying process are performed after the exposure process.

In accordance with another aspect of the inventive concept, there is provided a method for treating a substrate, the method including a first treatment operation of developing a substrate, on which an exposure process has been performed, by supplying a development liquid and then drying the substrate, and a second treatment operation of, after the first treatment operation, treating the substrate by supplying a development liquid to the substrate and supplying a supercritical fluid to the substrate in a state in which the development resides on the substrate.

The development liquid of the first treatment operation and the development liquid of the second treatment operation may be the same.

In the second treatment operation, a development process, a cleaning process, and a drying process may be performed in a process of treating the substrate with the supercritical fluid.

In the second treatment operation, a first process chamber that supplies a development liquid to the substrate and a second process chamber that treats the substrate with the supercritical fluid may be different, and the substrate may be fed to the second process chamber immediately after the development liquid is supplied by the first process chamber.

The exposure process may be performed after a negative photosensitive liquid is applied to the substrate.

The development liquid may be n-butyl acetate.

The supercritical fluid may include carbon dioxide.

In accordance with another aspect of the inventive concept, there is provided a method for treating a substrate, the method including a development process is performed by supplying a development liquid to a substrate, on which an exposure process has been performed, and supplying a supercritical fluid to the substrate before a photosensitive liquid applied on the substrate is developed by the development liquid.

The exposure process may be performed after a negative photosensitive liquid is applied to the substrate, and the development liquid is n-butyl acetate.

In accordance with another aspect of the inventive concept, there is provided a method for treating a substrate, wherein the substrate is treated by supplying a process fluid to the substrate, on which an exposure process has been performed, and supplying a supercritical fluid to the substrate in a state in which the substrate is wetted by the process fluid, wherein the process fluid is hexane if a positive photosensitive liquid is applied to the substrate and the substrate is provided in a state in which an exposure process has been performed on the substrate, and wherein the process fluid is n-butyl acetate if a negative photosensitive liquid is applied to the substrate and the substrate is provided in a state in which an exposure process has been performed on the substrate.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Hereinafter, a substrate treating apparatus 100 according to the inventive concept will be described.

The substrate treating apparatus 100 perform a supercritical process of treating a substrate S by using a supercritical fluid.

Here, the substrate S is an inclusive concept including a semiconductor device or a flat panel display (FPD), and other substrates used for manufacturing objects in which a circuit pattern is formed on a thin film. Examples of such substrates S include silicon wafers, glass substrates, and organic substrates. The substrate S is in a state in which a photosensitive liquid applying process and an exposure process have been already performed on the substrate S.

Figure 1:
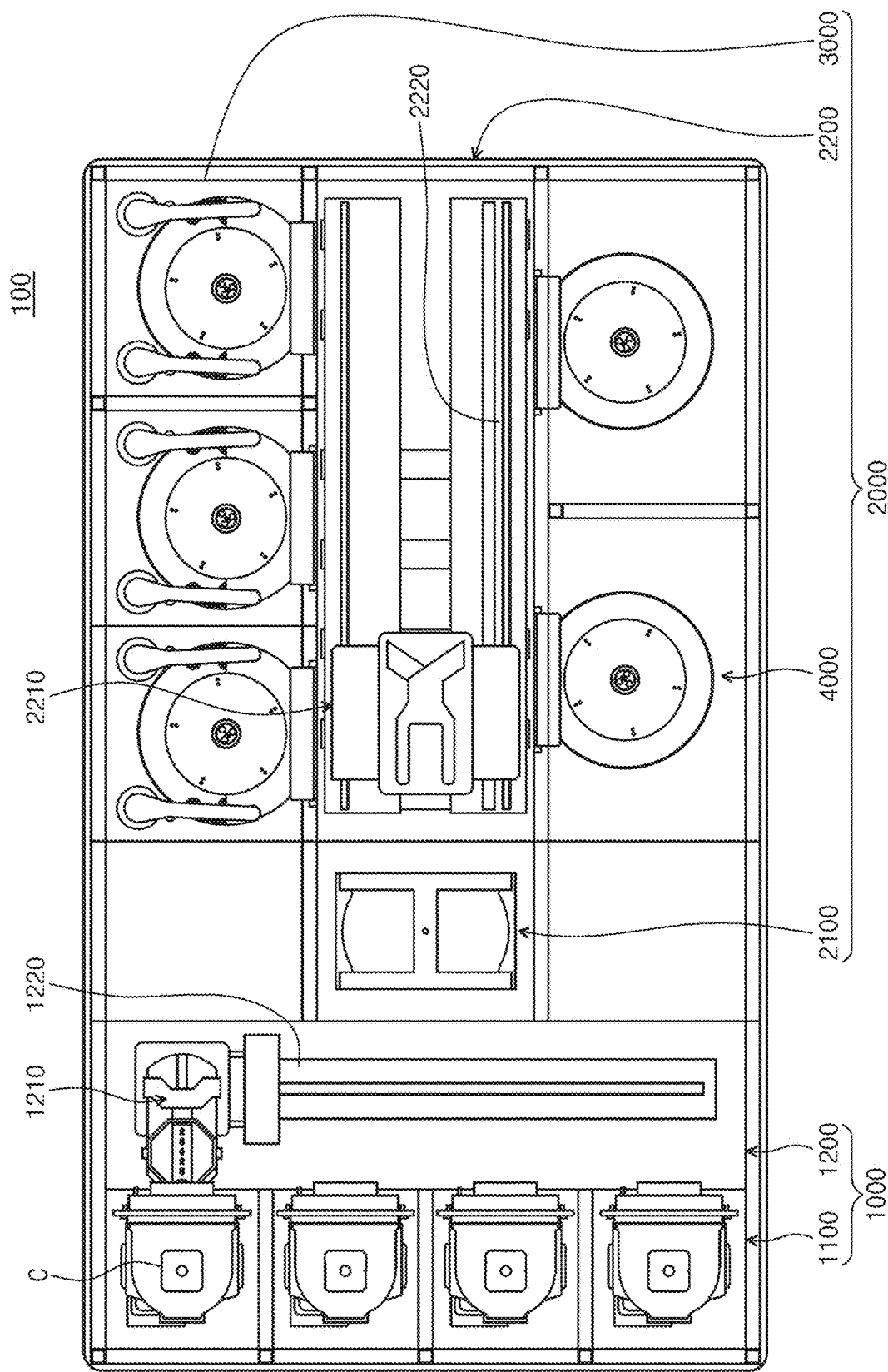
FIG. 1 is a plan view illustrating a substrate treating apparatus according to an embodiment of the inventive concept.

FIG. 1 is a plan view illustrating a substrate treating apparatus according to an embodiment of the inventive concept.

Referring to FIG. 1, the substrate processing apparatus 100 includes an index module 1000 and a process module 2000.

The index module 1000 receives a substrate S from the outside and transfers the substrate S to the process module 2000. The process module 2000 performs a supercritical cleaning process.

The index module 1000 is an equipment front end module (EFEM), and includes a load port 1100 and a feeding frame 1200.

A container C in which the substrate S is accommodated is positioned on the load port 1100. A front opening unified pod (FOUP) may be used as the container C. The container C may be carried into the load port 1100 from the outside by an overhead transfer (OHF), or may be carried out of the load port 1100.

The feeding frame 1200 delivers the substrate S between the container C positioned on the load port 1100 and the process module 2000. The feeding frame 1200 includes an index robot 1210 and an index rail 1220. The index robot 1210 may transfer the substrate S while moving on the index rail 1220.

The process module 2000 includes a buffer chamber 2100, a feeding chamber 2200, a first process chamber 3000, and a second process chamber 4000.

The buffer chamber 2100 provides a space in which the substrate S transferred between the index module 1000 and the process module 200 temporarily stays. A buffer slot may be provided in the buffer chamber 2100. The substrate S is positioned in the buffer slot. For example, the index robot 1210 may extract the substrate S from the container C and may position the substrate S in the buffer slot. The feeding robot 2210 of the feeding chamber 2200 may extract the substrate S positioned in the buffer slot, and may feed the substrate S to the first process chamber 3000 or the second process chamber 4000. A plurality of buffer slots may be provided in the buffer chamber 2100, and a plurality of substrates S may be positioned in the buffer slots.

The feeding chamber 2200 delivers the substrate S between the buffer chamber 2100 disposed at a circumference of the feeding chamber 2200, the first process chamber 3000, and the second process chamber 4000. The feeding chamber 2200 may include a feeding robot 2210 and a feeding rail 2220. The feeding robot 2210 may transfer the substrate S while moving on the feeding rail 2220.

The first process chamber 3000 and the second process chamber 4000 treat the substrate, on which the exposure process has been performed. The first process chamber 3000 and the second process chamber 4000 are disposed on side surfaces of the feeding chamber 2200. For example, the first process chamber 3000 and the second process chamber 4000 are disposed on different side surface of the feeding chamber 2200 to face each other.

The process module 2000 may include a plurality of first process chambers 3000 and a plurality of second process chambers 4000. The plurality of process chambers 3000 and 4000 may be disposed in a row on a side surface of the feeding chamber 2200, may be disposed to be stacked on one another, or may be disposed through a combination thereof.

Of course, the disposition of the first process chamber 3000 and the second process chamber 4000 is not limited to the aforementioned example, and may be changed in consideration of a footprint or a process efficiency of the substrate processing apparatus 100. The substrate treating apparatus 100 may be controlled by a controller 5000 (see FIG. 2).

Figure 2:
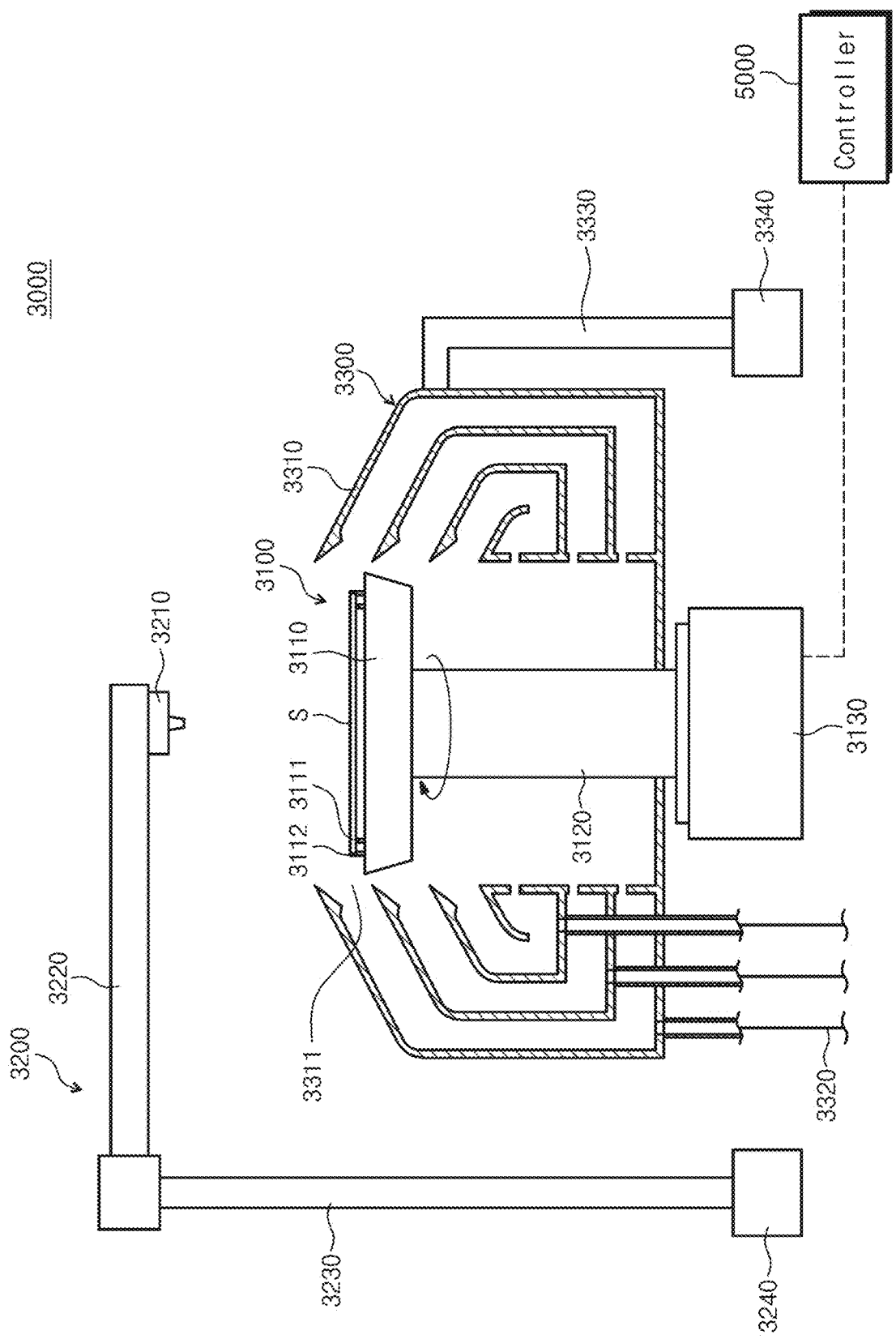
FIG. 2 is a sectional view of a first process chamber of FIG. 1.

FIG. 2 is a sectional view of a first process chamber of FIG. 1.

Referring to FIG. 2, the first process chamber 3000 includes a support member 3100, a nozzle member 3200, and a recovery member 3300.

The first process chamber 3000 treats the substrate S, on which the exposure process has been performed.

The support member 3100 supports the substrate S. The support member 3100 may rotate the supported substrate S. The support member 3100 includes a support plate 3110, a rotary shaft 3120, and a rotation driver 3130.

The support plate 3110 has an upper surface having a shape that is the same as or similar to the substrate S. A support pin 3111 and a chuck pin 3112 are formed on the upper surface of the support plate 3110. The support pin 3111 supports a bottom surface the substrate S. The chuck pin 3112 may fix the supported substrate S.

A rotary shaft 3120 is connected to a lower portion of the support plate 3110. The rotary shaft 3120 receives a rotational force from the rotation driver 3130 and rotates the support plate 3110. Accordingly, the substrate S positioned on the support plate 3110 may be rotated. The chuck pin 3112 prevents the substrate S from deviating from a predetermined location.

The nozzle member 3200 ejects a process fluid to the substrate S. The nozzle member 3200 includes a nozzle 3210, a nozzle bar 3220, a nozzle shaft 3230, and a nozzle shaft driver 3240.

The nozzle 3210 ejects a process fluid to the substrate S seated on the support plate 3110. The nozzle 3210 is formed on the bottom surface of one end of the nozzle bar 3220. The nozzle bar 3220 is coupled to a nozzle shaft 3230. The nozzle shaft 3230 is provided to elevate or rotate. The nozzle shaft driver 3240 may adjust the location of the nozzle 3210 by elevating or rotating the nozzle shaft 3230.

The recovery member 3300 recovers the process fluid supplied to the substrate S. If the process fluid is supplied to the substrate S by the nozzle member 3200, the support member 3100 may uniformly supply the process fluid to the entire area of the substrate S by rotating the substrate S. If the substrate S is rotated, the process fluid spatters from the substrate S. The spattering process fluid may be recovered by the recovery member 3300.

The recovery member 3300 may include a recovery vessel 3310, a recovery line 3320, an elevation bar 3330, and an elevation driver 3340.

The recovery vessel 3310 is provided to have an annular ring shape that surrounds the support plate 3110. A plurality of recovery vessels 3310 may be provided. The plurality of recovery vessels 3310 has a ring shape and sequentially become far away from the support plate 3110 when viewed from the top. The recovery vessels 3310 have larger heights as they go far away from the support plate 3110. A recovery hole 3311 through which the fluid spatters from the substrate S is formed in a space between the recovery vessels 3310. A recovery line 3320 is formed on the lower surface of the recovery vessel 3310.

The elevation bar 3330 is connected to the recovery vessel 3310. The elevation bar 3330 receives power from the elevation driver 3340 and moves the recovery vessel 3310 upwards and downwards. When a plurality of recovery vessels 3310 are provided, the elevation bar 3330 may be connected to the outermost recovery vessel 3310. The elevation driver 3340 may adjust a recover hole 3311, through which the spattered process fluid is introduced, from a plurality of recovery holes 3311 by elevating the recovery vessels 3310 through the elevation bar 3330.

Figure 3:
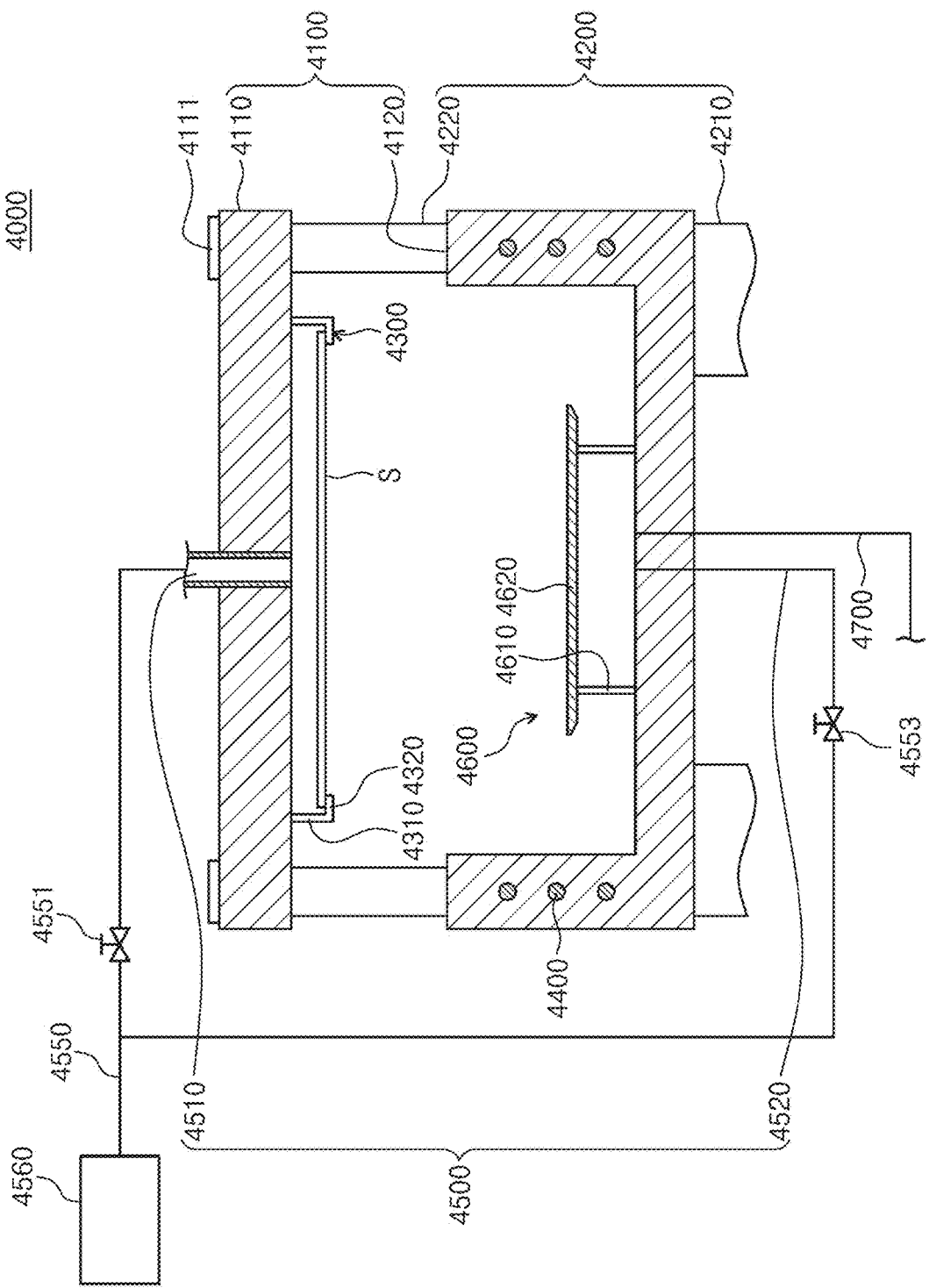
FIG. 3 is a sectional view of an embodiment of the second process chamber of FIG. 1.

FIG. 3 is a sectional view of an embodiment of the second process chamber of FIG. 1.

Referring to FIG. 3, the second process chamber 4000 may include a housing 4100, an elevation unit 4200, a support unit 4300, a heating member 4400, a fluid supply unit 4500, a blocking member 4600, an exhaust member 4700, and an agitation unit 4800. The second process chamber 4000 performs a process of treating a substrate by using a supercritical fluid.

The housing 4100 provides a treatment space in which a supercritical drying process is performed, in the interior thereof. The housing 4100 is formed of a material that endures a high pressure of more than a critical pressure.

The housing 4100 includes an upper body 4110 and a lower body 4120. The lower body 4120 is coupled to the upper body 4110 under the upper body 4110. The space generated through combination of the upper body 4110 and the lower body 4120 is provided as a treatment space for performing a substrate treating process.

The upper body 4110 is fixedly installed in an external structure. The lower body 4120 is provided to be elevated with respect to the upper body 4110. If the lower body 4120 is lowered to be spaced apart from the upper body 4110, the treatment space is opened. Through the opened treatment space, the substrate S may be carried into or carried out of the interior space of the second process chamber 4000. Here, the substrate S carried into the second process chamber 4000 is in a state in which the applied process fluid resides in the first process chamber 3000.

If the lower body 4120 is lifted to be attached to the upper body 4110, the treatment space is closed. In the closed treatment space, the substrate may be treated through the supercritical fluid. Unlike the above-described example, the lower body 4120 may be fixedly installed in the housing 4100, and the upper body 4110 may be elevated.

The elevation unit 4200 elevates the lower body 4120. The elevation unit 4200 includes an elevation cylinder 4210 and an elevation rod 4220. The elevation cylinder 4210 is coupled to the lower body 4120 to generate a vertical driving force. While the substrate is treated by using the supercritical fluid, the elevation cylinder 4210 generates a driving force that is high enough to seal the second process chamber 4000 by overcoming a high pressure of a threshold pressure or more in the interior of the second process chamber 4000 and attaching the upper body 4110 and the lower body 4120. One end of the elevation rod 4220 is inserted into the elevation cylinder 4210 and extends vertically upwards, and an opposite end of the elevation rod 4220 is coupled to the upper body 4110. If a driving force is generated in the elevation cylinder 4210, the elevation cylinder 4210 and the elevation rod 4220 may be relatively elevated, and the lower body 4120 coupled to the elevation cylinder 4210 also may be elevated. When the lower body 4120 is elevated by the elevation cylinder 4210, the elevation rod 4220 may prevent the upper body 4110 and the lower body 4120 from moving horizontally and guide the elevation direction of the lower body 4120, thereby preventing the upper body 4110 and the lower body 4120 from deviating from a proper location.

The support unit 4300 is located in the treatment space of the housing 4100 to support the substrate S. The support unit 4300 is coupled to the upper body 4110. The support unit 4300 includes a vertical part 4320 and a horizontal part 4310.

The vertical part 4320 extends downwards from an upper wall of the housing 4100. The vertical part 4320 is installed on a lower surface of the upper body 4110. The vertical part 4320 extends to the lower side of the upper body 4110. An end of the vertical part 4320 is coupled to the horizontal part 4310 perpendicularly to the horizontal part 4310. The horizontal part 4310 extends from an end of the vertical part 4320 to an inside of the housing 4100. The substrate S is positioned on the horizontal part 4310. The horizontal part 4310 supports a bottom surface of a peripheral area of the substrate S.

The support unit 4300 may contact an edge area of the substrate S to support the substrate S so that treatment of the substrate S through the supercritical fluid may be performed on an entire area of the upper surface of the substrate S and almost all area of the lower surface of the substrate S. Here, the upper surface of the substrate S may be a pattern surface, and the lower surface of the substrate S may be a non-pattern surface.

The support unit 4300 is installed in the upper body 4110. The support unit 4300 may support the substrate S stably while the lower body 4120 is elevated.

A horizontality adjusting member 4111 is installed in the upper body 4110, in which the support unit 4300 is installed. The horizontality adjusting member 4111 adjusts a horizontality of the upper body 4110. The horizontality of the substrate S located on the support unit 4300 installed in the upper body 4110 is adjusted by adjusting the horizontality of the upper body 4110. The upper body 4110 is elevated and the lower body 4120 is fixed, and when the support unit 4300 is installed in the lower body 4120, the horizontality adjusting member 4111 may be installed in the lower body 4120.

The heating member 4400 heats the interior of the second process chamber 4000. The heating member 4400 heats the supercritical fluid supplied to the second process chamber 4000 to a critical temperature or higher to maintain a phase of the supercritical fluid. When the supercritical fluid is liquefied, the heating member 4400 may heat the supercritical fluid such that the liquefied supercritical fluid is converted into a supercritical fluid again. The heating member 4400 is buried in at least one wall of the upper body 4110 and the lower body 4120. The heating member 4400 receives electric power from the outside to generate heat. As an example, the heating member 4400 may be a heater.

The fluid supply unit 4500 supplies a fluid to the second process chamber 4000. The supplied fluid may be a supercritical fluid. As an example, the supplied supercritical fluid may be carbon dioxide.

The fluid supply unit 4500 includes an upper fluid supply unit 4510, a lower fluid supply unit 4520, a supply line 4550, and valves 4551 and 4553.

The upper fluid supply unit 4510 directly supplies the supercritical fluid to an upper surface of the substrate S. The upper fluid supply unit 4510 is connected to the upper body 4110. The upper fluid supply unit 4510 is connected to the upper body 4110 that faces a central upper surface of the substrate S.

The lower fluid supply unit 4520 supplies the supercritical fluid to a lower surface of the substrate S. The lower fluid supply unit 4520 is connected to the lower body 4120. The lower fluid supply unit 4520 is connected to the lower body 4120 that faces a central lower surface of the substrate S.

The supercritical fluid ejected from the upper fluid supply unit 4510 and the lower fluid supply unit 4520 reaches a central area of the substrate S and is uniformly provided to the whole area of the substrate S while being spread out to an edge area of the substrate S.

The supply line 4550 is connected to the upper fluid supply unit 4510 and the lower fluid supply unit 4520. The supply line receives the supercritical fluid from a supercritical fluid storage unit and supplies the supercritical fluid to the upper fluid supply unit 4510 and the lower fluid supply unit 4520.

The valves 4551 and 4553 are installed in the supply line 4550. A plurality of valves 4551 and 4553 may be provided in the supply line. The valves 4551 and 4553 adjust the flow rates of the supercritical fluid supplied to the upper fluid supply unit 4510 and the lower fluid supply unit 4520. The valves 4551 and 4553 may adjust the flow rate of the supercritical fluid supplied into the housing 4100 by using a controller 5000.

First, in the fluid supply unit 4500, the lower fluid supply unit 4520 may supply the supercritical fluid. Thereafter, the upper fluid supply unit 4510 may supply the supercritical fluid. The supercritical drying process may be performed while the interior of the second process chamber 4000 does not reach a threshold pressure in an initial stage. When the interior of the second process chamber 4000 does not reach the threshold pressure, the supercritical fluid supplied into the interior of the second process chamber 4000 may be liquefied. If the supercritical fluid is liquefied, it may drop to the substrate S by gravity and thereby damage the substrate S.

Accordingly, the lower fluid supply unit 4520 supplies the supercritical fluid first. After the supercritical fluid is supplied to the second process chamber 4000, the internal pressure of the second process chamber 4000 reaches the threshold pressure. After the internal pressure of the second process chamber 4000 reaches the threshold pressure, the upper fluid supply unit 4510 supplies the supercritical fluid. The lower fluid supply unit 4520 supplies the supercritical fluid earlier than the upper fluid supply unit 4510, thereby preventing the supercritical fluid from being liquefied and dropping to the substrate S.

The blocking member 4600 prevents the supercritical fluid supplied from the fluid supply port 4500 from being directly ejected to a lower surface of the substrate S. The blocking member 4600 may include a blocking plate 4610 and a support 4620.

The blocking plate 4610 is located in the treatment space in the interior of the housing 4100. The blocking plate 4610 is disposed between the support unit 4300 and the lower fluid supply unit 4520. The blocking plate 4610 has a shape corresponding to the substrate S. As an example, the blocking plate 4610 may have a circular plate shape. The radius of the blocking plate 4610 may be similar to or larger than that of the substrate S. The blocking plate 4610 may be located on a lower surface of the substrate S positioned on the support unit 4300 to prevent the supercritical fluid supplied through the lower fluid supply unit 4520 from being directly ejected to the lower surface of the substrate S. When the radius of the blocking plate 4610 is similar to or larger than that of the substrate S, the supercritical fluid may be perfectly interrupted from being directly ejected to the substrate S.

Alternatively, the radius of the plate 4610 may be smaller than that of the substrate S. In this case, the supercritical fluid is interrupted from being directly ejected to the substrate S. Further, the supercritical fluid may be made to reach the substrate S relatively easily by minimally lowering the velocity of the supercritical fluid. When the radius of the blocking plate 4610 is smaller than that of the substrate S, a supercritical cleaning/drying process for the substrate S may be effectively performed.

The support 4620 supports the blocking plate 4610. The support 4620 supports a rear surface of the blocking plate 4610. The vertical part 4620 is installed on a lower wall of the housing 4100 to be vertically installed. The blocking plate 4610 may be positioned on the support 4620 by the gravitational force of the block plate 4610 without any coupling.

Unlike this, the support 4620 and the blocking plate 4610 may be coupled to each other by using nuts and bolts. Further, the support 4620 and the blocking plate 4610 may be integrally formed.

The exhaust member 4700 exhausts the supercritical fluid from the second process chamber 4000. The exhaust member 4700 may be connected to the exhaust line 4750 that exhausts the supercritical fluid. Then, a valve (not illustrated) for adjusting the flow rate of the supercritical fluid exhausted to the exhaust line 4750 may be installed in the exhaust member 4700. The supercritical fluid exhausted through the exhaust line 4750 may be discharged to the air or may be supplied to a supercritical fluid recycling system (not illustrated). The exhaust member 4700 may be coupled to the lower body 4120.

At an late stage of the substrate treating process using the supercritical fluid, the supercritical fluid may be exhausted from the second process chamber 4000 so that the internal pressure of the second process chamber 4000 may be reduced to a critical pressure or lower and the supercritical fluid may be liquefied. The liquefied supercritical fluid may be discharged by the gravitational force through the exhaust member 4700 formed in the lower body 4120.

Figure 4:
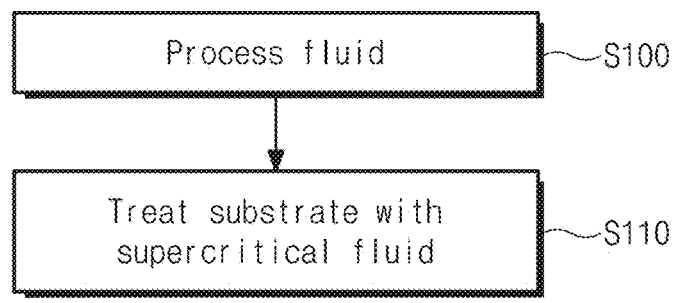
FIG. 4 is a view illustrating a process of treating a substrate.

FIG. 4 is a view illustrating a process of treating a substrate;

Referring to FIG. 4, a process fluid is supplied to the substrate S that has been carried in (S100). The substrate S is provided in a state in which the photosensitive liquid applying process, the exposure process, the development liquid applying process, and the drying process have been already performed. The photosensitive liquid applied to the substrate S may be a negative photosensitive liquid, and the development liquid may be one that is suitable for the negative photosensitive liquid. The development liquid applied to the substrate S may be n-butyl acetate. The process fluid is n-butyl acetate like the development liquid. The application of the process fluid is performed in the first process chamber 3000.

Thereafter, the substrate S is carried into the second process chamber 4000 in a state where the process fluid resides on the substrate S, and is processed by the supercritical fluid(S110).

Figure 5:
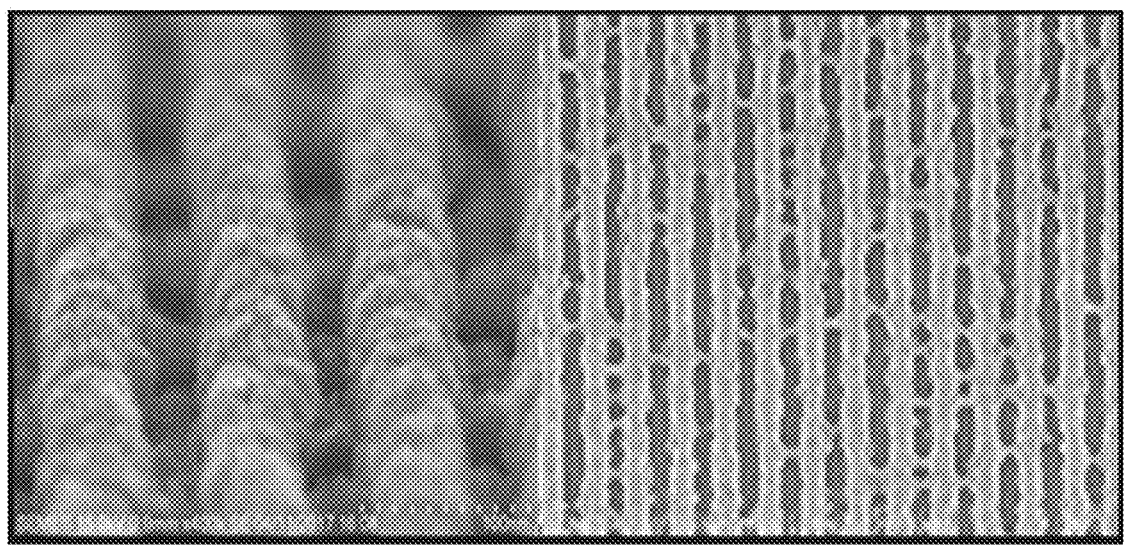
FIG. 5 is a view illustrating a pattern of the substrate formed according to a conventional process.

FIG. 5 is a view illustrating a pattern of the substrate formed according to a conventional process.

Referring to FIG. 5, a pattern is formed in the substrate, on which the photosensitive liquid applying process, the exposure process, the development liquid applying process, and the drying process have been performed. The chemical properties of the photosensitive liquid change through the exposure process. Thereafter, if the development liquid is applied, a portion of the substrate, which is not exposed to light in the exposure process, is removed from the substrate. As the patterns formed in the substrate becomes finer, the interval between adjacent patterns becomes gradually smaller. Accordingly, the development liquid applied to the substrate in the development liquid applying process is not sufficiently supplied between the adjacent patterns. Accordingly, a portion of the substrate, which has to be removed after being changed in to a removable state by the development liquid, cannot be sufficiently removed. Accordingly, the surfaces of the finished patterns are not uniform or a pattern bridging phenomenon in which some areas between the adjacent patterns are stuck to each other occurs. The defect of the finished pattern deteriorates a substrate treatment quality in the following processes.

Figure 6:
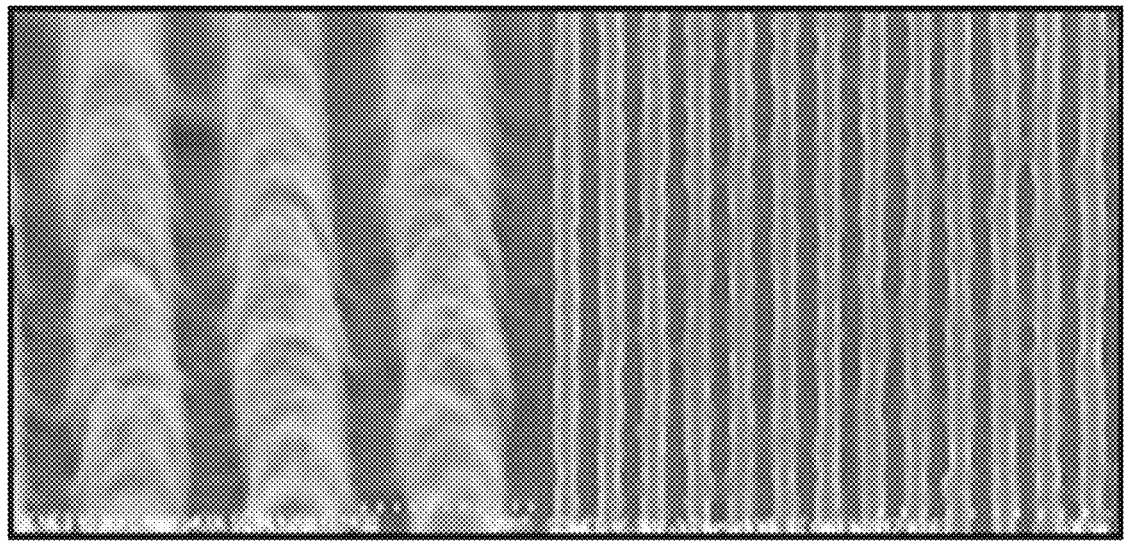
FIG. 6 is a view illustrating a pattern of the substrate treated according to the process of FIG. 4.

FIG. 6 is a view illustrating a pattern of the substrate treated according to the process of FIG. 4.

Referring to FIG. 6, the residual materials generated between the patterns in the process executing process are effectively removed from the substrate S, which has been treated according to the embodiment of the inventive concept and on which the photolithographic process has been completely performed so that the surfaces of the patterns are uniform and no pattern bridging phenomenon occurs between the adjacent patterns. The substrate S is treated by a fluid in a supercritical state while the process fluid is applied to the substrate S. The process fluid that is n-butyl acetate is well solved in a supercritical fluid, such as carbon dioxide in a supercritical state. Accordingly, the process fluid permeates between the patterns excellently while being solved in the supercritical fluid to treat the substrate S. Then, the process fluid may effectively react with the materials between the patterns as it has a chemical property by which the substrate S may be developed. Accordingly, the materials between the patterns may be effectively cleaned by the process fluid solved in plasma. Further, the process fluid that cleaned the substrate S is discharged after being solved in plasma and a drying process together with the cleaning process is performed on the substrate S.

As another example, the photosensitive liquid applying process and the exposure process may have performed on the substrate S provided in the execution of the process. The photosensitive liquid applied to the substrate S may be a negative photosensitive liquid. Thereafter, after the process fluid is applied to the substrate S provided in the execution of the process, the substrate S is treated by the supercritical fluid in a wet state with the process fluid. The process fluid may be n-butyl acetate. Then, the process fluid is supplied to the substrate S, the treatment of the substrate S through the supercritical fluid may be initiated before the substrate S is developed. Accordingly, a development process, a cleaning process, and a drying process may be performed in the process of treating the substrate S with the supercritical fluid.

Figure 7:
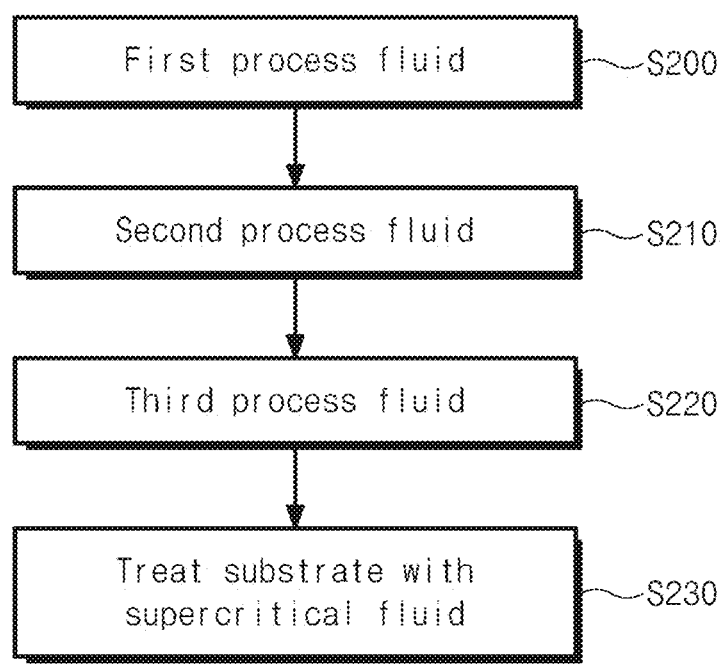
FIG. 7 is a view illustrating a process of treating a substrate according to another embodiment.

FIG. 7 is a view illustrating a process of treating a substrate according to another embodiment.

Referring to FIG. 7, the substrate treating apparatus 100 treats a substrate S, to which a development liquid has been applied, according to a preset process. The substrate S is provided in a state in which a development liquid that is suitable for a positive photosensitive liquid is applied after the positive photosensitive liquid is applied and exposed. As an example, the development liquid applied to the substrate S may be tetra methyl ammonium hydroxide (TMAH). Like tetra methyl ammonium hydroxide, the development liquid used in the development of the positive photosensitive liquid is not solved in a supercritical fluid.

A first process fluid is supplied to the substrate S (S200). The first process fluid may rinse the substrate S, to which the development liquid has been applied. The first process fluid may be pure water.

Thereafter, a second process fluid is supplied to the substrate S (S210). The second process fluid may be a mixture liquid of a hydrophobic organic solvent and a surfactant. The hydrophobic organic solvent may be hexane. Because the second process fluid contains a surfactant, the hydrophilic first process fluid applied to the substrate S is smoothly replaced by the second process fluid containing the hydrophobic organic solvent.

Thereafter, a third process fluid is supplied to the substrate S (S220). The third process fluid is a hydrophobic organic solvent. The hydrophobic organic solvent may be hexane. The conversion from the supply of the second process fluid to the supply of the third process fluid may be continuously performed. For example, in the process of supplying the hydrophobic organic solvent containing a surfactant, the supply of the second process fluid may be converted to the supply of the third process fluid by interrupting the surfactant mixed with the hydrophobic organic solvent. Then, the surfactant may be supplied while being mixed with a preset amount of a hydrophobic organic solvent and then the supply of the surfactant may be intermittently stopped. Further, the amount of the surfactant contained in the hydrophobic organic solvent may decrease while the second process fluid is supplied. Further, the supply of the second process fluid and the supply of the third process fluid may be intermittently performed.

The application of the first to third process fluids may be performed in the first process chamber 3000.

Thereafter, the substrate S is carried into the second process chamber 4000 in a state in which the third process fluid resides in the substrate S. If the substrate S is carried in, the third process fluid is removed from the substrate S as the second process chamber 4000 supplies the supercritical fluid (S230).

According to the inventive concept, the substrate S, to which the development liquid has been applied, may be treated by the supercritical fluid so that the patterns may be prevented from collapsing in the process of treating and drying the substrate S after the development liquid is applied to the substrate S. Further, the hydrophilic organic solvent, such as isopropyl alcohol (IPA), damages the photosensitive liquid that forms a pattern in a process of reacting with the supercritical fluid. Meanwhile, the inventive concept prevents the patterns from being damaged as there is not hydrophilic organic solvent when the substrate S is exposed to the supercritical fluid.

As another embodiment, the second process fluid that is supplied to the substrate S after the first process fluid is supplied may be a hydrophilic organic solvent. For example, the hydrophilic organic solvent may be IPA. Because the second process fluid is a hydrophilic organic solvent, it may effectively replace the first process fluid applied to the substrate.

Thereafter, similarly, the substrate is dried by the supercritical fluid after the third process fluid that is a hydrophobic organic solvent is supplied to the substrate. Because the third process fluid is an organic solvent similarly to the second process fluid, the second process fluid may be replaced effectively.

According to an embodiment of the inventive concept, a substrate treating apparatus that efficiently treats a substrate and a substrate treating method may be provided.

According to an embodiment of the inventive concept, a substrate treating apparatus that performs a cleaning/drying process through a supercritical fluid in a photolithography and a substrate treating method may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A method for treating a substrate, the method comprising:
    developing a substrate, on which an exposure process has been performed, by supplying a first development liquid and then drying the substrate; and
    after the developing, treating the substrate by supplying a second development liquid to the substrate and supplying a supercritical fluid to the substrate while the second development liquid resides on the substrate.

2. The method of claim 1, wherein the first development liquid and the second development liquid are the same.

3. The method of claim 1, wherein the substrate is developed, cleaned, and dried during the treating the substrate by supplying a second development liquid to the substrate and supplying a supercritical fluid to the substrate.

4. The method of claim 1, wherein the treating the substrate by supplying a second development liquid occurs in a first process chamber, and the supplying a supercritical fluid to the substrate occurs in a second process chamber, the first process chamber being different from the second process chamber, and the substrate is fed to the second process chamber immediately after the second development liquid is supplied by the first process chamber.

5. The method of claim 1, wherein the exposure process is performed after a negative photosensitive liquid is applied to the substrate.

6. The method of claim 1, wherein the first development liquid and the second development liquid are n-butyl acetate.

7. The method of claim 1, wherein the supercritical fluid is carbon dioxide.

8. A method for treating a substrate, the method comprising:
    developing a substrate by,
        supplying a development liquid to the substrate, on which an exposure process has been performed, and
        supplying a supercritical fluid to the substrate before a photosensitive liquid applied on the substrate is developed by the development liquid.

9. The method of claim 8, wherein the exposure process is performed after a negative photosensitive liquid is applied to the substrate, and the development liquid is n-butyl acetate.

10. A method for treating a substrate comprising:
    supplying a process fluid to the substrate, on which an exposure process has been performed; and
    supplying a supercritical fluid to the substrate while the substrate is wetted by the process fluid,
    wherein the process fluid is hexane if a positive photosensitive liquid is applied to the substrate,
    wherein the process fluid is n-butyl acetate if a negative photosensitive liquid is applied to the substrate, and
    wherein the treating the substrate by supplying the process fluid occurs in a first process chamber, and the supplying the supercritical fluid to the substrate occurs in a second process chamber, the first process chamber being different from the second process chamber.

* * * * *